(12) United States Patent
Deas et al.

(10) Patent No.: US 6,566,245 B2
(45) Date of Patent: May 20, 2003

(54) METHOD OF MANUFACTURING PROBE UNIT AND PROBE UNIT MANUFACTURED USING THIS METHOD

(75) Inventors: Alexander Roger Deas, Edinburgh (GB); Vladimir Nikolayevich Davydov, St.Petersburg (RU)

(73) Assignee: Acuid Corporation (Guernsey) Limited, Guernsey (GB)

( * ) Notice: Subject to any disclaimer, the term of this patent is extended or adjusted under 35 U.S.C. 154(b) by 0 days.

(21) Appl. No.: 10/090,828

(22) Filed: Mar. 6, 2002

(65) Prior Publication Data

US 2002/0102746 A1 Aug. 1, 2002

Related U.S. Application Data

(63) Continuation-in-part of application No. 09/481,122, filed on Jan. 11, 2000, which is a continuation-in-part of application No. PCT/RU99/00014, filed on Jan. 18, 1999.

(51) Int. Cl.[7] ............... H01L 21/4763; H01L 21/00
(52) U.S. Cl. ............... 438/624; 438/6; 438/22
(58) Field of Search ............... 438/624, 763, 438/778, 781, 790, 22, 23, 6

(56) References Cited

U.S. PATENT DOCUMENTS

| 4,382,228 A | 5/1983 | Evans et al. ............... 324/758 |
| 4,866,375 A | 9/1989 | Malloy ............... 324/754 |
| 4,975,638 A | 12/1990 | Evans et al. ............... 324/158 |
| 5,103,557 A | 4/1992 | Leedy ............... 438/6 |
| 5,307,561 A | 5/1994 | Feigenbaum et al. ............... 29/846 |
| 5,326,428 A | 7/1994 | Farnworth et al. ............... 156/654 |
| 5,354,205 A | 10/1994 | Feigenbaum et al. ............... 439/67 |
| 5,869,974 A | 2/1999 | Akram et al. ............... 324/754 |
| 6,064,217 A | 5/2000 | Smith ............... 324/760 |
| 6,124,721 A | 9/2000 | Farnworth et al. ............... 324/758 |
| 6,208,155 B1 | 3/2001 | Barabi et al. ............... 324/754 |
| 6,239,376 B1 * | 5/2001 | Kimura et al. ............... 174/36 |
| 6,436,849 B1 * | 8/2002 | Hasunuma et al. ............... 438/778 |

FOREIGN PATENT DOCUMENTS

| EP | 0 755 071 A | 1/1997 | ............... H01L/21/66 |
| KR | WO9721105 A | 6/1997 | ............... G01R/1/073 |
| RU | WO9936790 A | 7/1999 | ............... G01R/1/073 |
| WO | WO9409513 A | 4/1994 | ............... H01L/23/48 |

* cited by examiner

Primary Examiner—John F. Niebling
Assistant Examiner—Walter L. Lindsay, Jr.

(57) ABSTRACT

A method for producing a probe unit for contacting an electronic circuit such as a wafer or a die having a predetermined pattern of contact pads deployed in a common plane. The method employs a base plate of made of a material capable of surface uplift when irradiated. On the surface of the base plate locations corresponding to said contact pads are determined. Further, the base plate is irradiated at the determined locations by means of a laser. This results in forming conical surface uplifts. The method further includes plating the conical surface uplifts with an electrically conductive material and providing means for electical connection between said plated conical surface uplifts and an external device.

22 Claims, 7 Drawing Sheets

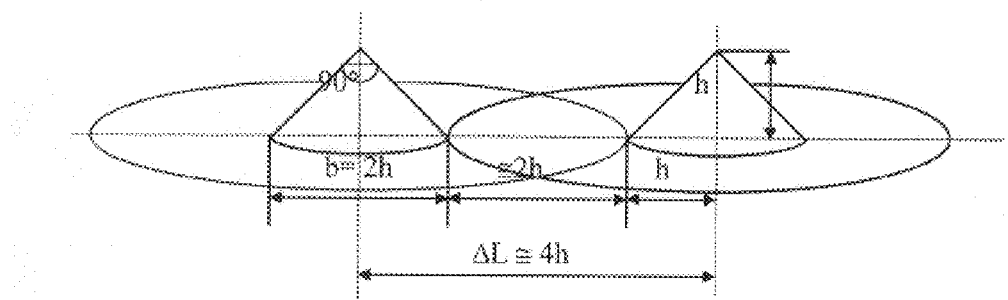
Fig.5a
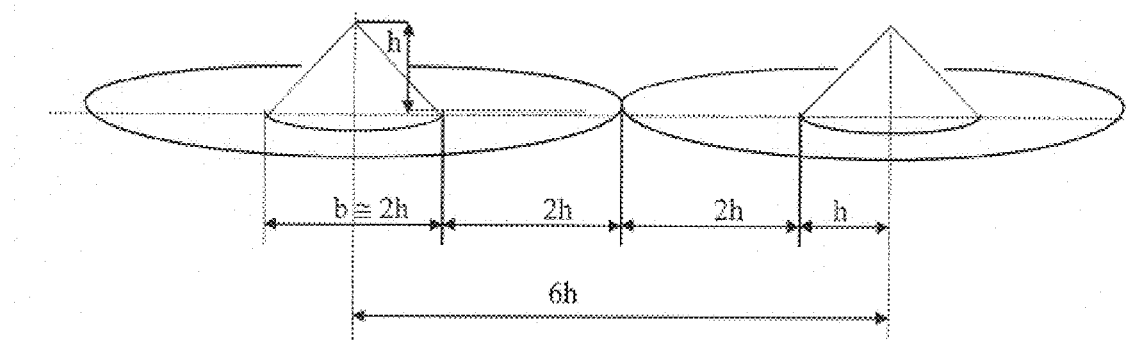
Fig.5b
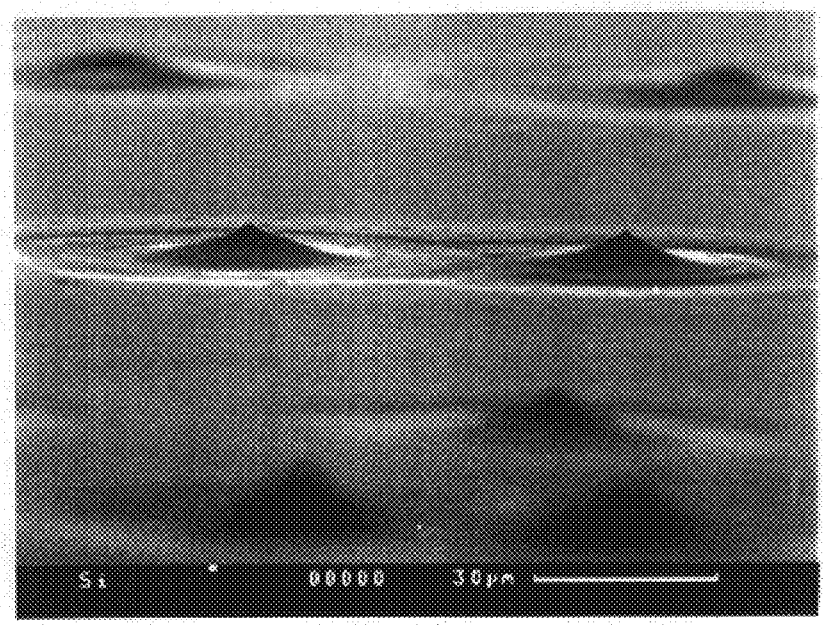

METHOD OF MANUFACTURING PROBE UNIT AND PROBE UNIT MANUFACTURED USING THIS METHOD

BACKGROUND OF THE INVENTION

1. Field of the Invention

The present invention relates generally to a probe unit for contacting an electronic circuit such as an integrated circuit and, more particularly, to a probe unit having probes arranged in a pattern matching the contact pads of the integrated circuit.

The probe unit can be used for connecting the contacted integrated circuit that can be a memory device to an external device, e.g. a testing device with.

2. Description of the Related Art

In the semiconductor industry, the fabrication of monocrystalline monolithic integrated circuits involves their formation on a single microelectronic substrate formed on a silicon wafer. The circuits are applied to the wafer by lithography (e.g. photolithography, electron, ion or x-ray lithography), each wafer containing an array of identical integrated circuits. The wafer is then sliced into dies, so that each die or chip carries a single semiconductor device. To assure that the various circuits are functioning properly, several testing operations are performed after each stage of fabrication, usually at wafer stage using a wafer probe, and in some processes also using a bare die probe, and again after packaging using a packaged die probe.

Each semiconductor wafer includes many dies, typically several hundred. A typical wafer probe card is such as that described in U.S. Pat. No. 4,382,228. A conventional test probe unit includes an array of metal needles, or probes, in a fixed ring, which is mounted and electrically connected to a printed circuit board. Each needle has to engage a respective contact pad on the device being tested. However, when the density of contact pads of the device is high, a slight imprecision will cause the needles touching each other, thereby rendering the unit defective. Besides, manufacturing of probe unit of this type is very complex and requires alignment means.

Silicon chips are usually encapsulated in a plastic or ceramic package. However, the packaging of a chip is relatively costly and time consuming, the package greatly reduces the circuit density and degrades the electrical performance of the semiconductor device. At present, there is a strong drive towards the use of a bare silicon die without any package. As a significant number of chips may be defective, it is extremely important to test the bare die before installing it in a working printed circuit board.

A probe unit may require making contact with 1000 to 1600 contact pads (4 to 200 contact pads in each die, depending on die type, testing 16, 32, 64, 128, 256 die simultaneously). Since all the contact pads on the wafer lie in a common plane and must be contacted simultaneously, it is essential that all tips or points of the probes lie in a plane parallel to the common plane of the wafer and match die contact pads.

A test probe unit capable of testing an unpackaged die has been disclosed in U.S. Pat. No. 4,975,638. This patent describes a test assembly including a rectangular frame and a contactor fabricated from a dielectric flexible film with planar portion which sags below the frame. The probes are formed in the planar portion of the contactor. The test probe unit is adapted for contacting closely spaced contact pads arranged in a common plane, however only a limited number (typically, 4) of dies can be contacted for testing simultaneously. Moreover, displacement in Z axis causes corresponding displacement in X and Y axis, thus resulting in relatively low arrangement accuracy of the test assembly. The elasticity of flexible film is nonuniform along the film length and decreases with time. Manufacturing of the test assembly is complex and expensive.

A test probe unit disclosed in U.S. Pat. No. 5,103,557 comprises a baseplate made e.g. of a flexible silicon dioxide, a plurality of microscopic probe points arranged in the same pattern as contact pads of the tested device, connectors for connecting the probes to a testing device and conductors for providing electrical connection between the probes and the connectors. The contact points are the highest raised surface features having a hard metal core, a compressible portion, and a tip optionally plated with gold. The compressible probe points accommodate the height variances of the various dies, thus showing the independent height adjustment capability of each probe point which can be as much as 40% of its length and providing uniform pressure for all closely spaced probe points. However, the prior art unit has a relatively high cost due to the complexity of its design and multistage character of the manufacturing process. Moreover, the maintaining of the probes in their working condition when in use is complex and requires repeating the manufacturing steps.

Known are probe cards made on semiconductor substrates comprising a plurality of interconnection probes (EP 0755071 filed Jul. 18, 1996). A semiconductor device used as a probe card comprises a semiconductor substrate and a plurality of probe points formed as ball-bumps in recesses on the surface of the substrate Another wafer probe card is made of a silicone wafer having curved microtips formed on said silicone wafer is described in WO97/21105 of Jun. 12, 1997. An interconnection structure comprising a semiconductor substrate with a plurality of probes forming insertion structure has been described in WO 94/09513 of Apr. 28, 1994. The process of manufacturing these probe cards is complicated and includes multiple steps to form the projections, e.g. etching and lithography, involving the use of chemicals that makes the probe card expensive and process of manufacturing the probe card non-environment-friendly.

Therefore, it is an acute necessity to create a relatively cheap and easily maintained probe unit for an in-process testing a bare die using environment friendly technique that avoids chemical pollution of the atmosphere.

BRIEF SUMMARY OF THE INVENTION

It is an object of the present invention to provide a simple and environment-friendly method of manufacturing a relatively cheap and easily-maintained probe unit having a plurality of probe points closely and accurately arranged in a common plane.

Another object of the present invention is to provide a probe unit wherein probe contacts lie in a common plane and correspond to contact pads of the semiconductor device with accuracy of up to ±1 micron.

According to the present invention, there is provided a method for producing a probe unit for contacting an electronic circuit having a predetermined pattern of contact pads deployed in a common plane, the method comprising the steps of making a test base plate of a material capable of surface uplift when irradiated, determining locations corresponding to said contact pads, irradiating the base plate at the determined locations until conical surface uplifts are formed; and providing means for electical connection between said conical surface uplifts and an external device.

Preferably, the surface irradiation is carried out by means of a laser.

The form of the microcontacts may be varied greatly by means of at least one of the parameters selected from the irradiation power density, irradiation impulse duration and/or dimensions of the irradiation zone. In one of the preferred embodiments the impulse energy source is a neodymium laser having a wavelength of 1054 nm, laser power density 7 kW/cm$^2$.

According to another aspect of the present invention, there is provided a method for producing a probe unit for contacting an electronic circuit having a predetermined pattern of contact pads deployed in a common plane, the method comprising the steps of making a base plate of a dielectric material plated with electrically conductive material capable of surface uplift when irradiated, determining on the plated surface of the base plate locations corresponding to said contact pads, irradiating the plated surface of the base plate at the determined locations until conical surface uplifts are formed; and providing means for electical connection between said conical surface uplifts and an external device.

According to another aspect of the present invention, there is provided a probe unit produced by employing the above method.

According to still another aspect of the present invention, there is provided a probe unit for contacting an electronic circuit having connector pads deployed in a predetermined pattern in a common plane, the probe unit comprising a base plate made of a material capable of surface uplift when irradiated, a number of cone-shaped surface uplift microcontacts integrally projected from the base plate at irradiated locations corresponding to said connector pad pattern of the semiconductor device; and means for electical connection between said conical surface uplift microcontacts and an external device.

Typically, center-to-center spacing between probe points of the probe unit is as much as twice the spacing between contact pads of the die, the latter being usually the same as the contact pad width. The center-to-center spacing may be, for example, 120 microns for pad width of 60 microns. This spacing may be obtained by adjusting the center-to-center spacing of the irradiation zones and may be varied in the course of manufacturing process. Usually, this spacing may also be calculated as not less than 2 h, preferably not less than 4 h, more preferably not less than 6 h, where h is the desired contact height.

Preferably, the height h of the surface uplift microcontacts is in the range from 4 micron to 100 microns, preferably from 15 microns to 25 microns.

Preferably, the base plate is made of a dielectric material, and the surface uplift microcontacts are coated with conductive material.

According to still another aspect of the present invention, there is provided a probe unit for contacting an electronic circuit having connector pads deployed in a predetermined pattern in a common plane, the probe unit comprising a base plate made of dielectric material plated with electrically conductive material capable of surface uplift when irradiated, cone-shaped surface uplift microcontacts formed from said electrically conductive plating; and means for electical connection between said conical surface uplift microcontacts and an external device.

Preferably, the base plate is an integrated circuit chip, the irradiated locations are chip connector pads, and the means for electical connection are conductive traces on the surface of the integrated circuit.

Preferably, the plating comprises at least two layers, of which the inner layer is nickel, and the outer layer is gold.

According to still another aspect of the present invention, there is provided a probe unit for contacting an electronic circuit having connector pads deployed in a predetermined pattern in a common plane, the probe unit comprising a base plate made of a dielectric material, a number of surface uplift microcontacts formed on flexible elements mounted on the base plate; and means for electical connection between said conical surface uplift microcontacts and an external device, wherein the flexible elements comprise a material capable of surface uplift when irradiated, the surface uplift microcontacts are plated with a conductive material, and the means for electical connection are conductive traces on the dielectric base plate.

Preferably, the plating comprises at least two layers, the inner layer being nickel, and the outer layer being gold.

Preferably, the flexible elements are made of the material capable of surface uplift when irradiated.

Preferably, the flexible elements are plated with a material capable of surface uplift when irradiated.

The conductive material may be selected from metals and alloys providing the overall electrical resistance of less than 0.1 Ohm. Typically, the contact material may be selected from a group including copper, aluminium, gold or non-oxidising metals, such as non-oxidising precious metals. In some cases, to reduce the cost of a conductive layer and to enhance the adhesion to the surface of the dielectric material, precious metals may be used as the upper plating layer only, the inner layer being formed from metals having high adhesion to dielectric materials. The inner layer metals may be selected from the group including, but not limited to, nickel, tungsten, chromium, titanium, palladium, beryllium-copper alloy, or combinations thereof. The primer inner layer may be plated on the surface microcontacts formed on a dielectric base plate.

The dielectric material may be selected from the group including, but not limited to, silicon, silicon dioxide, silicon nitride, germanium, germanium dioxide, indium antimonide, nickel phosphide, gallium alloys, as well as some metal compounds and plastics capable of surface uplift being subjected to irradiation. Dielectric materials having maximum difference between liquid and solid state density are preferable.

Several probe units of the invention can be formed on a single base plate for simultaneously testing a plurality of dies. A significant advantage of the invention is that the probe contacts lie in a common plane and correspond to contact pads of the semiconductor device with accuracy of up to ±1 micron. The proposed invention avoids using complex means for maintaining the contacts in a common plane and reduces the time required for positioning the probe points in one plane in the course of testing procedure, thus increasing the test speed and total manufacturing yield.

BRIEF DESCRIPTION OF THE SEVERAL VIEWS OF THE DRAWINGS

For a better understanding of the present invention and to show how the same may be carried into effect, reference will now be made, by way of example, to the accompanying drawings in which:

FIG. 5 shows the cone shapes and relationship between the center-to-center spacing and microcontact height in accordance with the present invention.

DETAILED DESCRIPTION OF THE INVENTION

Figure 1:
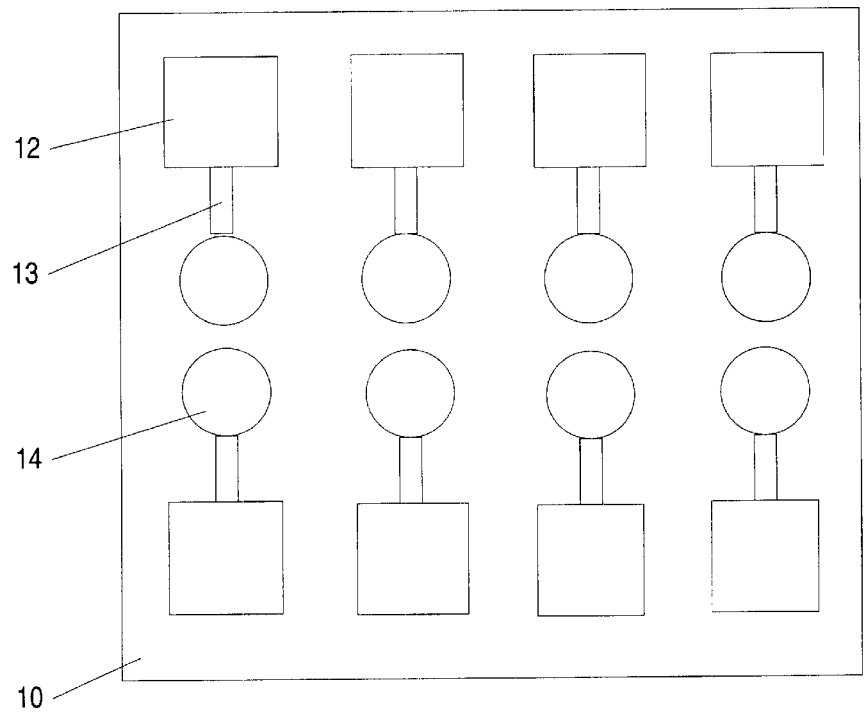
FIG. 1 shows the block diagram of the probe unit in accordance with one embodiment of the present invention.

A probe unit in accordance with one embodiment of the present invention shown in FIG. 1 consists of a dielectric base plate 11 and microcontacts or probes or probe points 14 coated with metal film. The base plate 11 is provided with connectors 12 and conductors 13 that make up means for electical connection between said microcontacts and an external device (not shown). The dielectric base plate 11 provides electric isolation of the conductive parts 12, 13, 14 of the probe unit. The use of the silicon base plate provides maximum reduction of the thermal shift of the probe unit during test procedure in relation to the connector pads of the die which is also fixed on the silicon plate. Conductors 13 provide electrical connection between the probes 14 and connectors 12. The connectors 12 are used to electrically connect the probe unit to an external device, e.g. testing device.

Figure 2:
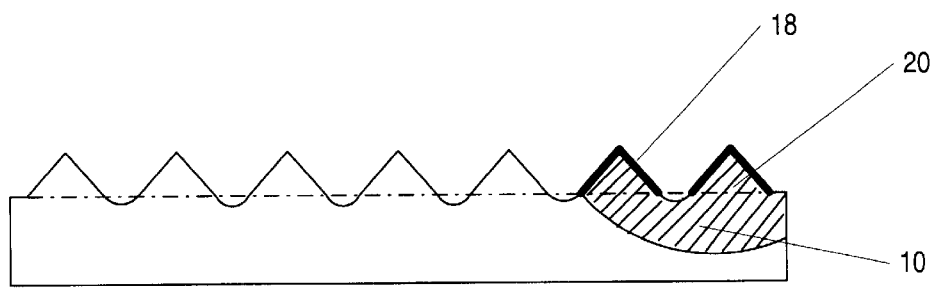
FIG. 2 shows a cross section of the probe points formed on the base plate in accordance with the present invention.

A cross-section of the microcontacts 14 formed on the surface of the base plate is presented in FIG. 2. The microcontacts are composed of cone-shaped uplifts 24 integrally projecting from the base plate 21, and a thin film 241 of conductive material plated on the cone surface. The conductive film 241 may include two or more layers of conductive material.

Figure 3:
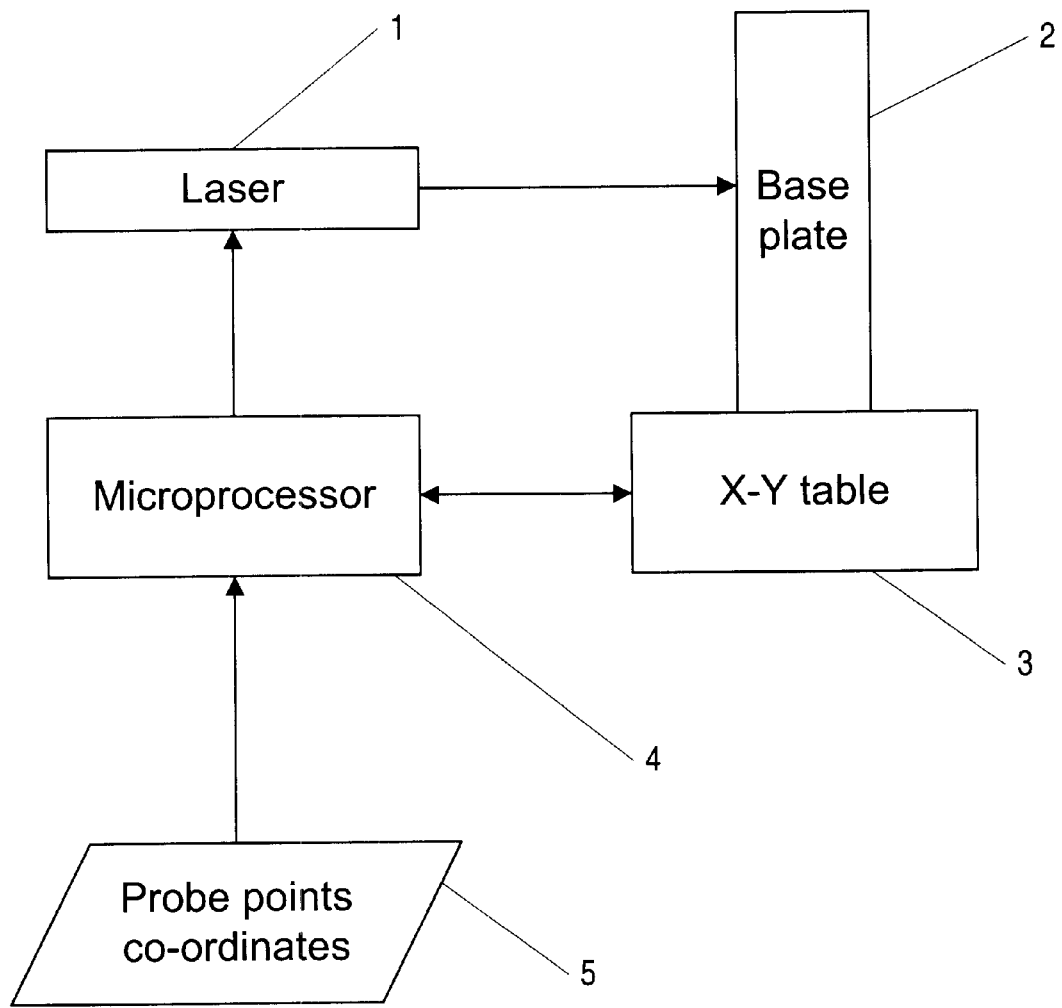
FIG. 3 shows the block diagram illustrating the method of producing the probe unit in accordance with the proposed invention.

A method of producing the probe points on the surface of the base plate is illustrated in FIG. 3.

As base plate, a silicone plate is used. On the surface of the base plate, locations are determined corresponding to contact pads of the electronic circuit (a die or wafer) to be contacted by the probe unit.

The next step includes irradiating the base plate at the determined locations until conical surface uplifts are formed. The irradiation of a power impulse laser is focused on the surface of the base plate. The surface of the base plate is positioned substantially perpendicular to the irradiation direction. The irradiation energy may be controlled by means of a calorimeter (not shown), on which a part of the basic laser beam may be separated by a separation plate. Filters may also be used for adjusting the energy power of the laser beam. Firstly, the base plate, by means of an x–y table, is brought to a starting position. Then, the surface of the base plate is irradiated by a laser beam activated for a predetermined time sufficient for melting down the base plate surface in the irradiated zone and causing a surface uplift. Rapid heating and subsequent cooling of the silicon surface results in the formation of a cone-shaped microjut that can be used as a microcontact. After each irradiation shot, the base plate is moved mechanically by means of a conventional x–y table, for a relative distance corresponding to a center-to-center spacing between contact pads of the IC to be tested. Due to optical pumping asymmetry, the irradiation may be partially polarized in the movement direction. A multimode irradiation generator is used. The operations of positioning and irradiating are repeated. The process can be controlled with a microprocessor programmed with probe points coordinates.

Further steps include plating the conical surface uplifts with an electrically conductive material and providing means for electical connection between said plated conical surface uplifts and an external device.

The probe unit according to the present invention is intended mainly for contacting contact pads of a die or wafer. The major probe unit parameters that can affect wafer yields and require routine maintenance are mostly mechanical. These parameters include planarity, alignment, probe point diameter and probe point surface. Further, an important electrical parameter is contact resistance. (see T. M. Schnack, J. A. Allison "Probe Card Maintenance: A Key To Improving Wafer Test Performance", Probe Technology Corporation, Santa Clara, Calif.).

Figure 4:
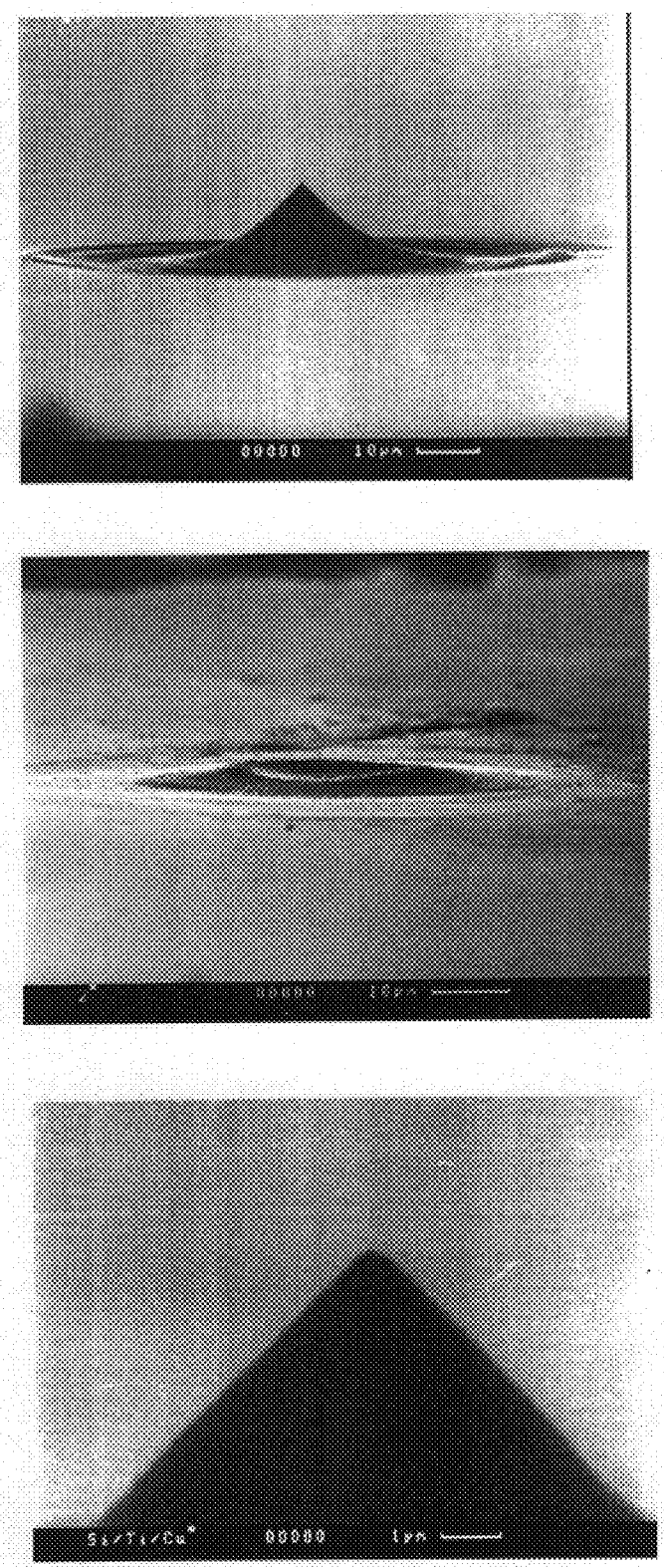
In FIG. 4 scanning electron microphotographs are presented showing the probe points formed on the surface of a dielectric base plate made of monocrystalline silicon.

Planarity, or co-planarity, is defined as the maximum difference in heights h between all the probe points. Using a reference surface on the probe unit circuit board, the plane of the probe points should be parallel to this reference surface and the points should be all in the same plane or within a close tolerance. The industry standard specification for planarity on a new probe unit is 0.7 mils or approximately 18 microns. One of the main advantages of the present invention is that the process of the laser beam surface modification has significant reproducibility of the resulting cone microcontact heights. For cone contacts with height of 20 microns height deviations of less than 1 micron may be achieved. The example structures are presented in FIG. 4. Another advantage to be found is that the microcontact height may be easily varied by the laser power density, laser impulse duration or dimensions of the irradiation zone. For instance, when the surface of a monocrystalline silicon is treated by a neodymium laser beam having wavelength of 1054 nm, power density of 7 kW/cm$^2$ and impulse duration from 300 to 500 ns, contact heights from 15 to 30 microns may be produced.

The alignment of the probe unit is defined as the X, Y position of the probe point on the contact pad of the die to be tested, with respect to a known X, Y coordinate location (typically pad center). The alignment is a critical parameter, since misalignment of the probe can not only result in no electrical contact, but also cause damage to the passivation layer. The typical industry standard specification for alignment of a new probe unit is ±12 microns from pad center for single die probe units or ±18 microns for multidie probe units. An important advantage of the proposed invention is that the alignment procedure is built-in in the production method, as locations to be irradiated in the course of the probe growing process are defined by the X, Y coordinates of the contact pads of the device. As the proposed method uses irradiation by laser beam, the obtained probe units have very high probe point arrangement accuracy. This accuracy depends only on the accuracy of the base plate positioning system with respect to the laser axis. Available precision positioning systems provide high positioning accuracy with deviation of less than 0.01 microns in the range of 200×200 mm.

High resolution degree, i.e. the minimum center-to-center spacing between two adjacent probes, may be achieved in the present invention, the spacing may also be easily varied by varying the locations to be irradiated and dimensions of the irradiation zone. The high resolution degree provides the high density of the resulting probe unit.

Since the probes are "grown up" on the surface of the base plate from the material of the base plate itself, when a cone has grown, its peripheral zone becomes slightly dented, the dented area diameter being 3 diameters of the cone base in the case of a cone angle being approximately 90 degrees. Then, the minimum possible resolution, i.e. center-to-center spacing, is $\Delta L \equiv 4$ h, where h is a microcontact height. When h=20 micron, $\Delta L \equiv 80$ micron (see FIG. 5a). Preferably, to provide high reproducibility of the cone shape, i.e. to ensure each cone is formed fully independently from the other, the center-to-center spacing $\Delta L \equiv 6$ h shall be chosen, where h is a microcontact height. In this case, when h=20 micron, $\Delta L \equiv 120$ micron (see FIG. 5b).

The probe shape and point diameter. The tip diameter of the probe point is largely determined by the size of the contact pad of the die, taking into account the overdrive and scrub size. Typical specifications for tip diameter, dependent upon pad size, range from 25–50 microns. In accordance with the present invention, for a cone probe having a base diameter of 100 microns, the tip diameter amounts approximately to 1–3 microns, or up to 10 microns after cutting, while for a cone probe of smaller base diameters the tip diameters are correspondingly smaller and may be greatly varied, being not critical for the proposed probe unit.

Figure 6:
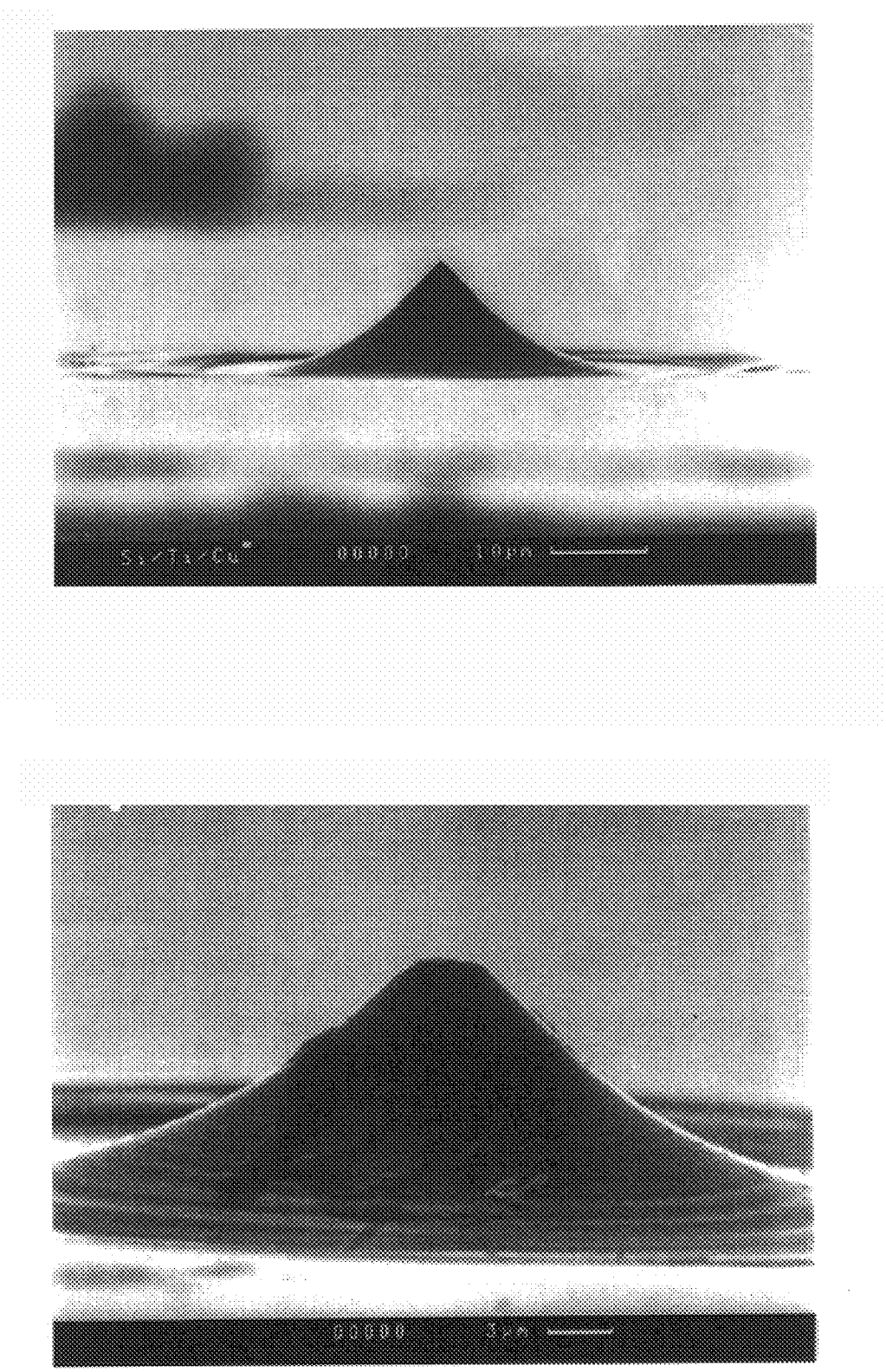
In FIG. 6 scanning electron microphotographs are presented showing the probe tip shapes in accordance with the present invention.

In addition to the tip diameter, the tip shape and surface also plays a significant role in the quality of the contact with the die. The tip shape of the cone probes produced by the proposed method is regular with the angle of approximately 90°, and may be flattened by cutting to a tip diameter of typically 10–15 microns. FIG. 6 shows the cone tip scanning electron microphotographs, the upper one being the tip view before cutting and the lower one after cutting. In case the probe points are made of the same dielectric material as the base plate, to provide the electrical contact, the tip surface is plated with a conductive material. Referring back to FIGS. 1 and 2, the contact layer 241 on the surface of the probes, connectors 12 and conductors 13 are formed using known metal film plating methods. The film may be, for example, made of tungsten, chromium, titanium or copper, or a precious metal. A film thickness of up to 1 micron may be achieved by evaporation procedures, thicker films generally require galvanic methods.

To contact the die, the probe interface is positioned facing the die contact pads and pressed by a special means. The thickness of conductive layer 241 of the probe points typically exceeds the height differences of the probe points in relation to the reference plane 20. Due to some deformation of the conductive film 241, the reliable electrical contact is achieved between the probe points and the device under test. The resulting contact resistance of a typical probe according to the present invention is less than 0.1 ohm. For comparison, the contact resistance of a conventional probe unit is about 1–2 ohms and may increase to 5–10 ohms under some circumstances, causing failures such as gross functional, speed reduction and continuity.

Figure 7:
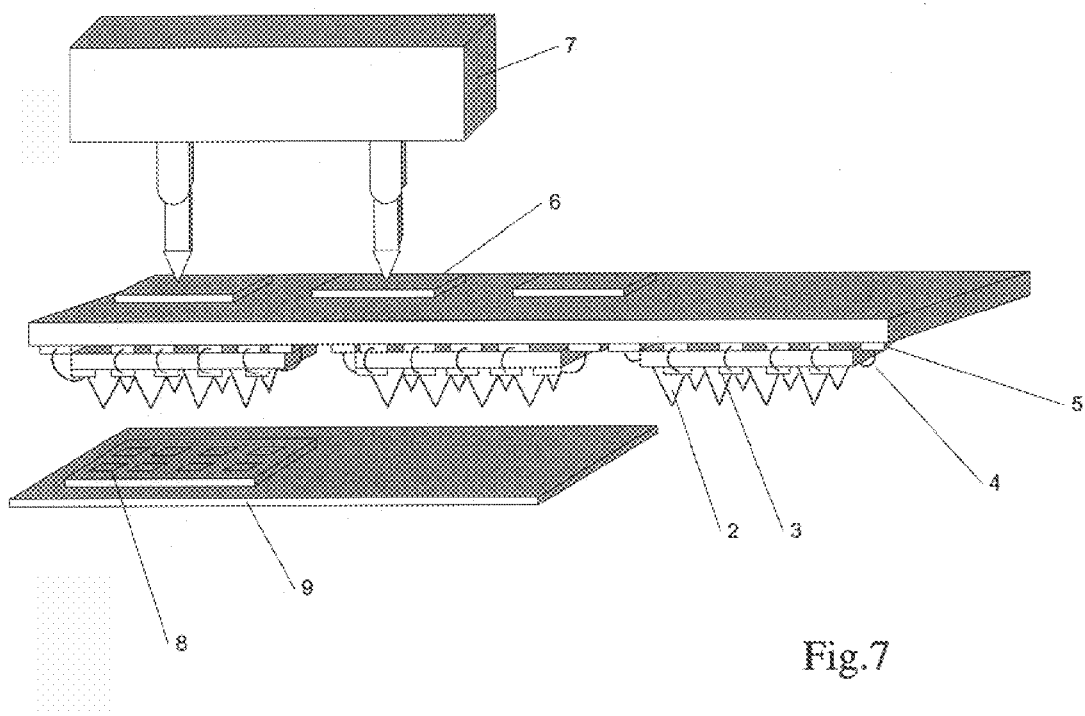
FIG. 7 is a schematic view of a test system using the probe unit having microcontacts formed on a dielectric baseplate in accordance with an embodiment of the present invention.

In another embodiment of the present invention, the proposed probe units can be arranged on a single base plate for simultaneously testing several dies. The system shown in FIG. 7 comprises a common plate 70 on which a predetermined pattern of probe units is arranged, preferably along the periphery of the base plate. Each probe unit consists of probes 74, base plate 71, conducting wires 731 and contactors 732 and is mounted on the common plate 70, by means of a spring device (not shown) accommodating for differences in die under test heights. Connectors 72 connect the probes with an external testing device 76. Dies 78 under test by means of a conventional X, Y table 79 are positioned facing the respective probe units. The test system may be connected with the probe unit by means of spring-loaded contacts. Where the tested dies differ considerably in height, each die can be pressed with a flexible device (not shown) against a corresponding set of probes.

Figure 8:
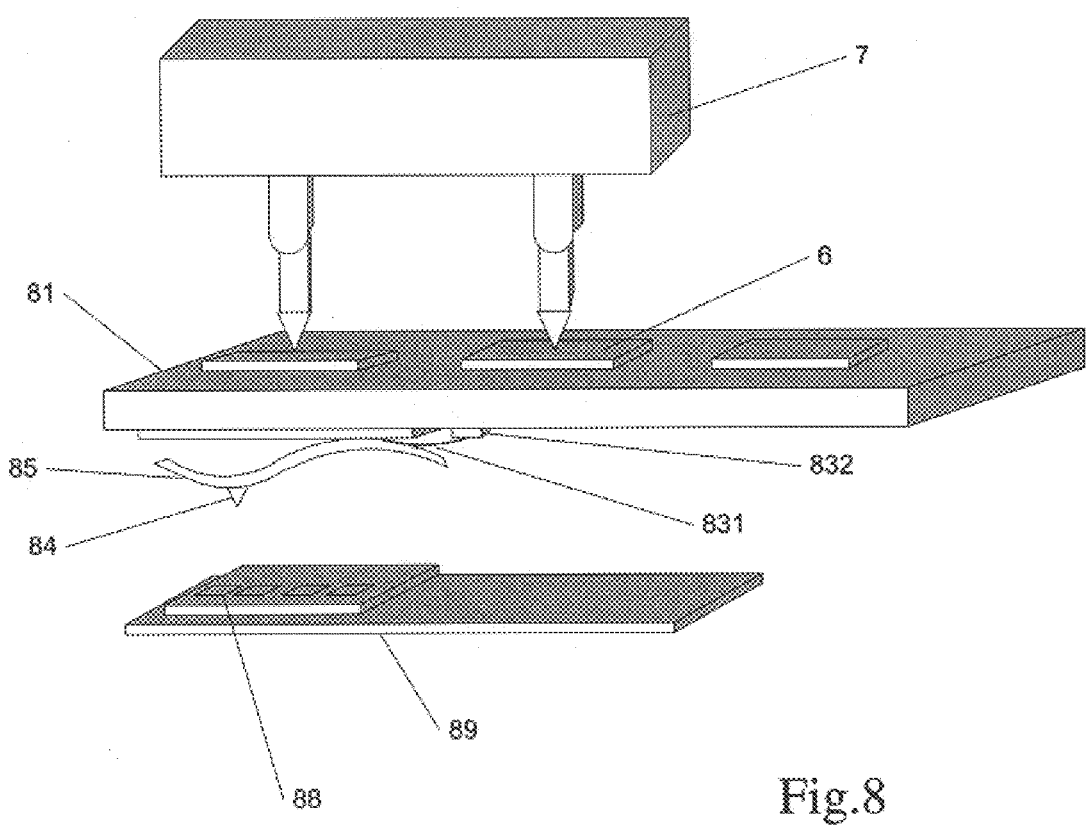
FIG. 8 is a schematic view of a test system using the probe unit having microcontacts formed on springs in accordance with an embodiment of the present invention.

In still another embodiment of the present invention, the probes are formed on springs mounted on a base plate to accommodate height variances of different die under test. The system shown in FIG. 8 comprises a common plate 80 on which a a predetermined pattern of probe units is arranged. Each probe unit comprises probes 84 formed on springs 85, conducting wires 831 and contactors 832. Connectors 82 connect the probes with an external testing device 86. By means of a conventional X, Y table 89, dies 88 under test are positioned against respective probe units. Where the tested dies differ considerably in height, each die can be pressed against a corresponding set of probes.

Cyclic work parameters. In use, probe units are subject to wear. Typical industry standards call for a preventive maintenance procedure to be performed every 10,000–20,000 contacts. For a conventional probe unit with buckling beam probes, parameters such as positional accuracy, co-planarity of the probes, and critical dimensions are subject to fast degradation with time and usage. The advantage of the proposed probe unit is that positional accuracy does not change with time, though co-planarity and critical dimensions of the cone probes changes slightly. As a consequence, the proposed probe unit, when made of gold, withstands about 25,000–30,000 touchdowns without special adjustment and, when made of tungsten, 100,000 or more. Moreover, an important advantage is the relatively low cost of a new probe unit production, that avoids expensive time-consuming repairing procedures involving the substitution of separate probes for those probe units that fail to pass the preventive maintenance program and rechecking the planarity and alignment of the repaired probe unit.

EXAMPLE 1

A base plate made of monocrystalline silicon having a thickness of 380 microns is irradiated by a neodymium laser beam, wave length 1.054 microns, power density 4 kW/cm$^2$, impulse duration 0.3 ms, beam diameter on the surface 20 microns. The locations to be irradiated are positioned with center-to-center spacing of 45 microns. The resulting cone heights are 5 microns, cone base diameter is 10 microns, probe shape is rounded cone with curvature radius 1 micron. After plating by evaporation, a gold film having a thickness of 0.05 microns is obtained on the surface of the cone, the cone height being about 5 microns, cone base diameter being the same.

EXAMPLE 2

A base plate made of a monocrystalline silicon having a thickness of 500 microns is irradiated by a neodymium laser beam, wave length 1.054 microns, power density 4 kW/cm$^2$, impulse duration 0.3 ms, beam diameter on the surface 80 microns. The locations to be irradiated are positioned with center-to-center spacing of 100 microns. The resulting cone heights are 15 microns ±0.5, cone base diameter is 36 microns, cone angle is nearly 90°. After cutting with conventional cutting tools, the probe shape is a truncated cone, cone height is 12 microns, tip radius is 3 microns. Then the cone surface is plated by evaporation, a gold film having a thickness of 0.2 micron being obtained, the cone height about 12 microns, cone base diameter being the same, cone tip diameter becoming 3 microns. Contact resistance of the probe unit is 0.03 ohm.

EXAMPLE 3

Springs made of phosphorous bronze, having a diameter of 80 microns, are mounted on a base plate made of monocrystalline silicon having a thickness of 330 microns. The base plate with springs is irradiated by neodium laser beam, power density 25 mW/cm$^2$, impulse duration 50 ns, beam diameter on the surface is 20 microns. The springs are positioned with center-to-center spacing of 150 microns. The resulting cone heights are 20 microns. Then the cones are plated by pure gold, the film thickness being 0.05 microns, cone shape is rounded cone, tip diameter is 1 micron. Contact resistance is 0.02 ohm.

EXAMPLE 4

A base plate made of monocrystalline silicon having a thickness of 380 microns is irradiated by neodymium laser beam, wave length 1.054 microns, power density 7 kW/cm$^2$, impulse duration 0.5 ms, beam diameter on the surface 60 microns. The locations to be irradiated are positioned with center-to-center spacing of 80 microns. The resulting cone heights are 20 microns ±0.5, cone base diameter is 40 microns, cone angle is nearly 87°. After plating by evaporation with titanium (film thickness is 0.1 micron) having good adhesion to silicon, a beryllium copper film having a thickness of 0.5 micron is obtained on the surface of the cone. Then the cones are plated by pure gold, the film thickness being 0.05 microns, the resulting cone height becoming about 21 microns, cone base diameter being 30 microns, cone shape is rounded cone, tip diameter is 1 micron.

EXAMPLE 5

On a common plate a plurality of base plates are mounted, each made of monocrystalline silicon having a thickness of 330 microns plated with titanium film having a thickness of 3 microns. The resulting structure is irradiated by a neodymium laser beam, wave length 1,054 microns, power density 5 kW/cm$^2$, impulse duration 0.2 ms, beam diameter on the surface is 10 microns. The locations to be irradiated are positioned on the base plates with center-to-center spacing of 30 microns. The resulting cone heights are 7 microns ±0.5, cone base diameter is 15 microns, cone tip diameter is 0.5 microns, tip radius is 0.5 micron. After plating by evaporation, a gold film having a thickness of 0.08 microns is obtained on the surface of the cone, the cone height is 7.1 microns, cone base diameter is 15 microns, cone tip diameter is 1 micron.

It will be appreciated that the above are example embodiments only and that various modifications may be made to the embodiments described above within the scope of the present invention.

We claim:

1. A method for producing a probe unit for contacting an electronic circuit having a predetermined pattern of contact pads deployed in a common plane, the method comprising the steps of:

providing a base plate comprising a material capable of surface uplift when irradiated, determining on the surface of the material capable of surface uplift locations corresponding to said contact pads, irradiating the base plate at the determined locations to form surface uplifts;

imparting surface uplifts electrical conductivity; and providing means for electrical connection between said surface uplifts and an external device.

2. The method as claimed in claim 1, wherein the base plate is made of a material capable of surface uplift when irradiated.

3. The method as claimed in claim 1, wherein electrical conductivity is provided by plating the surface uplifts with an electrically conductive material.

4. The method as claimed in claim 1, wherein electrical conductivity is provided by making the base plate of a dielectric material plated with electrically conductive material capable of surface uplift when irradiated.

5. The method as claimed in claim 1, wherein the surface irradiation is carried out by means of a laser.

6. The method as claimed in claim 1, wherein the surface irradiation is carried until conical surface uplifts are formed.

7. A probe unit for contacting an electronic circuit having a predetermined pattern of contact pads deployed in a common plane, the probe unit produced by the method comprising the steps of:

providing a base plate comprising a material capable of surface uplift when irradiated;

determining on the surface of the material capable of surface uplift locations corresponding to said contact pads, irradiating the base plate at the determined locations to form surface uplifts;

imparting surface uplifts electrical conductivity; and providing means for electrical connection between said surface uplifts and an external device.

8. The probe unit as claimed in claim 7, wherein the base plate is made of a material capable of surface uplift when irradiated.

9. The probe unit as claimed in claim 7, wherein electrical conductivity is provided by plating the surface uplifts with an electrically conductive material.

10. The probe unit as claimed in claim 7, wherein electrical conductivity is provided by making the base plate of a dielectric material plated with electrically conductive material capable of surface uplift when irradiated.

11. The probe unit as claimed in claim 7, wherein the surface irradiation is carried out by means of a laser.

12. The probe unit as claimed in claim 7, wherein the surface irradiation is carried until conical surface uplifts are formed.

13. A probe unit for contacting an electronic circuit having a predetermined pattern of connector pads deployed in a common plane, the probe unit comprising:

a base plate made of a material capable of surface uplift when irradiated;

a number of cone-shaped surface uplift microcontacts integrally projected from the base plate at irradiated locations corresponding to said connector pad pattern of the semiconductor device; and means for electrical connection between said conical surface uplift microcontacts and an external device.

14. The probe unit as claimed in claim 13, wherein the height h of the surface uplift microcontacts is in the range from 4 micron to 100 microns, preferably from 15 microns to 25 microns.

15. The probe unit as claimed in claim 13, wherein the base plate is made of a dielectric material, and the surface uplift microcontacts are coated with conductive material.

16. A probe unit for contacting an electronic circuit having a predetermined pattern of connector pads deployed in a common plane, the probe unit comprising:
- a base plate made of dielectric material plated with electrically conductive material capable of surface uplift when irradiated;
- cone-shaped surface uplift microcontacts formed from said electrically conductive plating; and
- means for electical connection between said conical surface uplift microcontacts and an external device.

17. The probe unit as claimed in claim 16, wherein the base plate is an integrated circuit chip, the irradiated locations are chip connector pads, and the means for electical connection are conductive traces on the surface of the integrated circuit.

18. The probe unit as claimed in claim 16, wherein the plating comprises at least two layers, of which the inner layer is nickel, and the outer layer is gold.

19. A probe unit for contacting an electronic circuit having a predetermined pattern of connector pads deployed in a common plane, the probe unit comprising:
- a base plate made of a dielectric material;
- a number of surface uplift microcontacts formed on flexible elements mounted on the base plate; and
- means for electrical connection between said conical surface uplift microcontacts and an external device, wherein
  - the flexible elements comprise a material capable of surface uplift when irradiated, the surface uplift microcontacts are plated with a conductive material, and the means for electical connection are conductive traces on the dielectric base plate.

20. The probe unit as claimed in claim 19, wherein the plating comprises at least two layers, of which the inner layer is nickel, and the outer layer is gold.

21. The probe unit as claimed in claim 19, wherein the flexible elements are made of the material capable of surface uplift when irradiated.

22. The probe unit as claimed in claim 19, wherein the flexible elements are plated with a material capable of surface uplift when irradiated.

* * * * *